United States Patent
Kim

(10) Patent No.: US 7,215,549 B2
(45) Date of Patent: May 8, 2007

(54) PLASMA DISPLAY DEVICE

(75) Inventor: Myoung-Kon Kim, Suwon-si (KR)

(73) Assignee: Samsung SDI Co., Ltd., Suwon-si (KR)

( * ) Notice: Subject to any disclaimer, the term of this patent is extended or adjusted under 35 U.S.C. 154(b) by 318 days.

(21) Appl. No.: 10/924,721

(22) Filed: Aug. 23, 2004

(65) Prior Publication Data

US 2005/0047068 A1    Mar. 3, 2005

(30) Foreign Application Priority Data

Aug. 26, 2003    (KR) .................. 10-2003-0059209

(51) Int. Cl.
*H05K 7/20* (2006.01)

(52) U.S. Cl. .................. 361/704; 361/681; 361/688; 165/80.3; 313/46; 313/582

(58) Field of Classification Search ............... 361/687, 361/700–704, 709, 719; 257/706, 712; 174/16.1, 174/16.3; 165/80.2, 80.3, 185; 345/60, 345/94, 68, 76, 77, 204–206; 349/20, 32, 349/73, 121, 161; 313/17, 495, 496, 483, 313/44, 46, 47, 582–587, 497, 24, 27, 634
See application file for complete search history.

(56) References Cited

U.S. PATENT DOCUMENTS 5,990,618 A * 11/1999 Morita et al. ............... 313/582
6,198,222 B1 * 3/2001 Chang ........................ 313/582
6,288,489 B1 * 9/2001 Isohata et al. ............... 313/582
6,735,084 B1 * 5/2004 Choi et al. .................. 361/704
6,737,790 B2 * 5/2004 Seki ........................... 313/47
6,744,186 B2 * 6/2004 Oishi et al. .................. 313/46
6,774,872 B1 * 8/2004 Kawada et al. ............... 345/60

FOREIGN PATENT DOCUMENTS

| JP | 9-97015 | 4/1997 |
| JP | 11-065485 | 3/1999 |
| JP | 2002-196683 | 7/2002 |
| KR | 1998-0011613 | 4/1998 |

OTHER PUBLICATIONS

Patent Abstracts of Japan, Publication No. 09-097015, Published Apr. 8, 1997, in the name of Tachibana, et al.
Patent Abstracts of Japan for Publication No. 2002-196683, Date of publication of application Jul. 12, 2002, in the name of J. Juen.
Patent Abstracts of Japan for Publication No. 11-065485; Date of publication of application Mar. 5, 1999, in the name of H. Inoue et al.

* cited by examiner

*Primary Examiner*—Michael Datskovskiy
(74) *Attorney, Agent, or Firm*—Christie, Parker & Hale, LLP

(57) ABSTRACT

A plasma display device includes a chassis base supporting a plasma display panel (PDP). A heat conducting medium is interposed between the chassis base and the PDP, and a heat sink presses toward the heat conducting medium through the penetration hole.

39 Claims, 9 Drawing Sheets

PLASMA DISPLAY DEVICE

CROSS REFERENCE TO RELATED APPLICATION

This application claims priority to and the benefit of Korean Patent Application No. 2003-59209 filed on Aug. 26, 2003 at the Korean Intellectual Property Office, the entire contents of which is incorporated herein by reference.

BACKGROUND (a) Field

The present invention relates to a plasma display device, and more particularly to a plasma display device having an enhanced heat radiation structure.

(b) Description of the Related Art

As is well known in the art, a plasma display device realizes a desired image using a plasma discharge. Such a plasma display device generally includes a plasma display panel (PDP) for rendering the desired image through plasma discharge activated by an external power source, a chassis base for firmly holding the PDP at its front side, and circuit boards mounted on a rear side of the chassis base for driving the PDP. Front and rear cases are combined with front and rear sides of a PDP module (i.e., a combination of a PDP, a chassis base, and circuit boards)to form such a plasma display device.

Since rendering of a desired image by a PDP is achieved using a plasma discharge as described above, a PDP generally produces a significant amount of heat during its image rendering. A PDP may be damaged when a temperature of thereof increases excessively, so heat dissipation efficiency of a PDP plays an important role in its durability. In this sense, increasing heat dissipation of a PDP has always been an important research topic in the field.

Examples of heat dissipation mechanisms of a PDP may be found in numerous prior technical documents, for example in Laid Open Japanese Patent publication 09-097015 (applicant: MATSUSHITA ELECTRIC IND CO. LTD, date of publication: Apr. 8, 1997), and Laid Open Korean Patent publication 1998-0011613 (applicant: MATSUSHITA ELECTRIC IND CO. LTD, date of publication: Apr. 30, 1998).

As can be gathered from the technical documents, a heat dissipation mechanism of a plasma display device according to the prior art may be generally summarized as follows.

A chassis base is formed of a metal (e.g., aluminum or a compound thereof) having high heat conductivity such that heat generated at a PDP may be easily dissipated. A heat transferring material such as a heat dissipation sheet is disposed between the PDP and the chassis base such that the heat generated at the PDP may be easily transferred to the chassis base. A heat dissipation member (e.g., a heat sink or cooling fins) is attached to a rear side of the chassis base such that a dissipation effect of heat occurs through a front side thereof from the PDP. Therefore, the heat generated at the PDP is transferred to the chassis base through the heat dissipation sheet, and is finally dissipated at the heat dissipation member.

According to such a heat dissipation mechanism of the prior art, when the chassis base and the PDP are attached interposing the heat dissipation sheet, air is frequently trapped to form a layer therebetween. This results from wide areas of the chassis base and the PDP having difficulty forming uniformly close contact therebetween at all spots, and in addition, because a sufficiently high pressure applied for attachment may easily cause damage to the PDP.

In order to reduce formation of such an air layer between the PDP and the chassis base interposing the heat dissipation sheet, according to the prior art, slits for discharging air are frequently formed at the heat dissipation sheet, or the thickness of the heat dissipation sheet is varied in different areas.

However, such features do not sufficiently prevent the occurrence of such an air layer at areas that need to be cooled by dissipating heat. That is, such an air layer is still frequently formed at some locations of the wide PDP-attached area that are unpredictable and uncontrollable.

Different amounts of heat are generated at the PDP at different areas and, accordingly, a surface temperature of the PDP becomes different at different areas. It is therefore preferable that a heat dissipation mechanism of a plasma display device be enhanced such that heat dissipation efficiency may be determined and controlled appropriately, depending on the area of need.

Another problem presented by the prior art heat dissipation mechanism is that negative effects of the dissipated heat on circuit boards mounted on a rear side of the chassis base are ignored, since the general concern has only been about dissipation of heat generated at the PDP. The heat of the PDP is dissipated mainly through the rear side of the chassis base, and such dissipated heat affects elements included in the circuit boards mounted at the rear side of the chassis base. That is, the heat of air heated at the rear side of the chassis base is easily transferred to the elements of the circuit boards mounted at the rear side of the chassis base, e.g., through leads on the surface of the circuit boards.

Therefore, a reduction of heat transfer from a chassis base to a circuit board may enhance the stability and durability of a plasma display device.

SUMMARY

An exemplary plasma display device according to an embodiment of the present invention includes a plasma display panel (PDP), a chassis base for supporting the PDP and having at least one penetration hole, a heat conducting medium interposed between the chassis base and the PDP, and a heat sink disposed at the penetration hole and pressing toward the heat conducting medium.

In a further embodiment, such a plasma display device further includes a conjoining device formed at one side of the chassis base, and forming a pressure of the heat sink toward the heat conducting medium and conjoining with the heat sink. In some embodiments, the heat sink is conjoined with the conjoining device directly, and in other embodiments, the heat sink is conjoined with the conjoining device by at least one interposed member.

In a still further embodiment, a plurality of projections is formed on the heat sink.

When the heat sink is conjoined with the conjoining device through at least one interposed member, the at least one member may cover the plurality of projections.

An air passage of a generally vertical direction may be formed by the plurality of projections In another still further embodiment, the heat sink and/or the at least one interposed member have at least one boss formed in a direction opposite to the chassis base. In this embodiment, at least one circuit board is conjoined to the boss.

The conjoining device may include a conjoining boss, and in one embodiment, a sum of a thickness of the chassis base and a height of the conjoining boss may be smaller than a distance between an area of the heat sink facing the conjoining boss and an area of the heat sink facing the heat conducting medium.

The conjoining device may also include a conjoining boss and an elastic member. In this embodiment, at least part of the elastic member is disposed proximate to an upper end of the conjoining boss.

In some embodiments, the elastic member includes a rubber member disposed on the upper end of the conjoining boss or a spring disposed generally coaxially with the conjoining boss.

A heat dissipation unit may alternatively replace the heat sink and be disposed at the penetration hole by at least part thereof and press toward the heat conducting medium.

In a further embodiment, the plasma display device further includes a conjoining device formed at one side of the chassis base, forming a pressure of the heat dissipation unit toward the heat conducting medium. The heat dissipation unit may be conjoined to the rear side of the chassis base by the conjoining device.

In a still further embodiment, a plurality of projections is formed at the heat dissipation unit. An air passage of a generally vertical direction may be formed by the plurality of projections, which may also project in a direction opposite to the chassis base. The heat dissipation unit may include a plate member for covering the plurality of projections.

In another still further embodiment, at least one boss is formed at the heat dissipation unit in a direction opposite to the chassis base, and at least one circuit board is conjoined to the boss. In this case such conjoined circuit board can become more thermally stable.

The conjoining device may include a conjoining boss, and a sum of a thickness of the chassis base and a height of the conjoining boss may be smaller than a distance between an area of the heat dissipation unit facing the conjoining boss and an area of the heat dissipation unit facing the heat conducting medium.

The conjoining device may include a conjoining boss and an elastic member, and at least part of the elastic member is disposed proximate to an upper end of the conjoining boss.

The elastic member may include a rubber member disposed on the upper end of the conjoining boss or a spring disposed generally coaxially with the conjoining boss.

DETAILED DESCRIPTION

Figure 1:
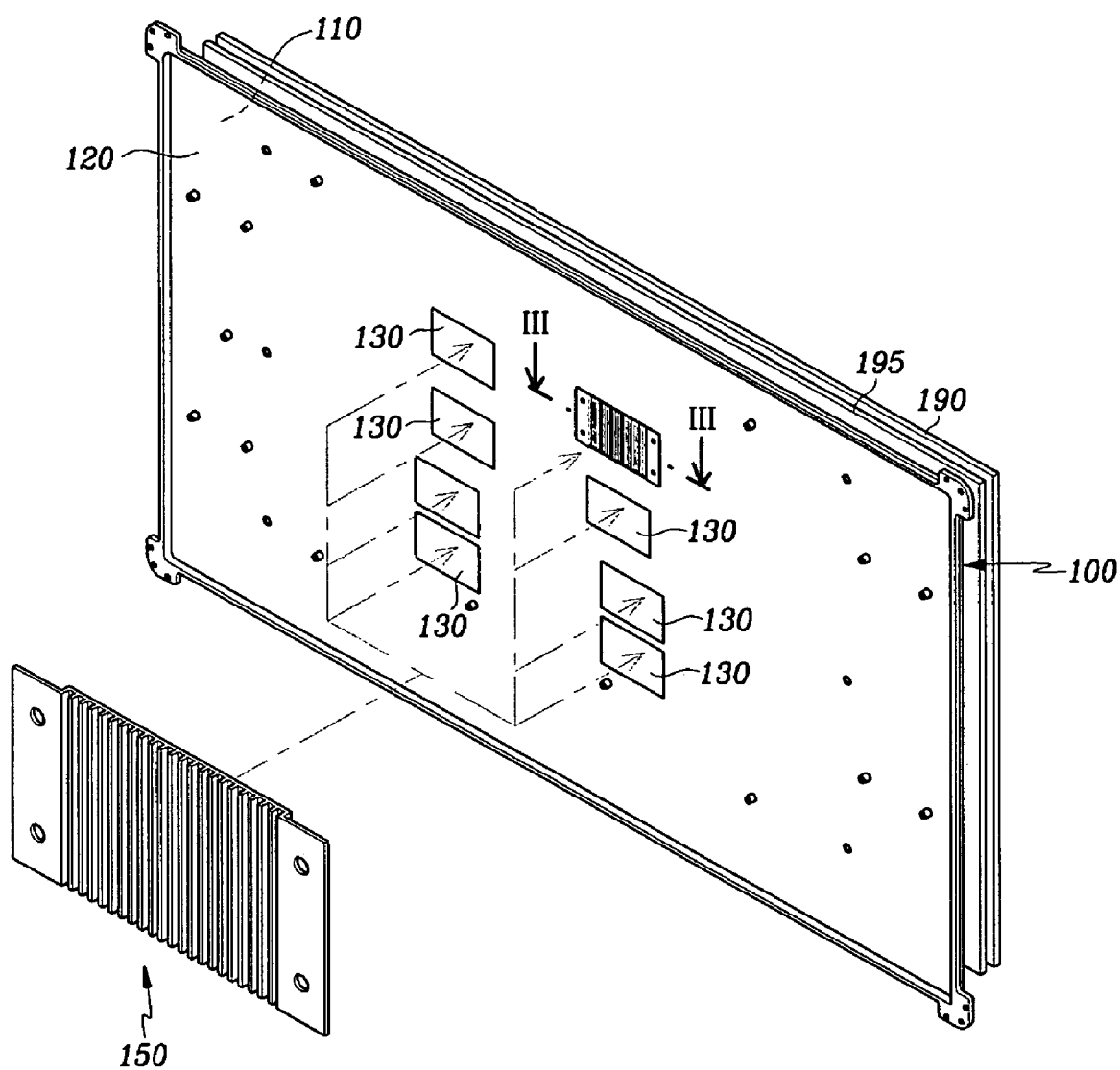
FIG. 1 is an exploded perspective view of a plasma display device according to a first embodiment of the present invention.

As shown in FIG. 1, a plasma display device according to a first embodiment of the present invention includes a chassis base 100, a plasma display panel (PDP) 190 attached at a front side 110 of the chassis base 100 and supported thereby, and a heat conducting medium 195 interposed between the chassis base 100 and the PDP 190 such that heat generated at the PDP 190 may be transferred to the chassis base 100.

The heat conducting medium 195 may be a heat dissipation sheet, as is well known in the art. However, one skilled in the art will understand that the heat conducting medium may be any suitable shape or substance capable of conducting heat.

Penetration holes 130 are formed in an interior of the chassis base 100. FIG. 1 shows eight (8) penetration holes 130 of a rectangular shape. However, one skilled in the art will understand that any suitable number and shapes of the penetration holes 130 may be substituted for those shown in the pictured embodiments.

A heat sink 150 is disposed at each penetration hole 130 and is pressurized toward the heat conducting medium 195.

A conjoining device 310 (refer to FIGS. 3–6) is formed at a rear side 120 of the chassis base 100, for forming pressure on the heat sink 150 toward the heat conducting medium 195 such that the heat sink 150 is pressurized to the heat conducting medium 195. The conjoining device 310 is described below in further detail.

Figure 2:
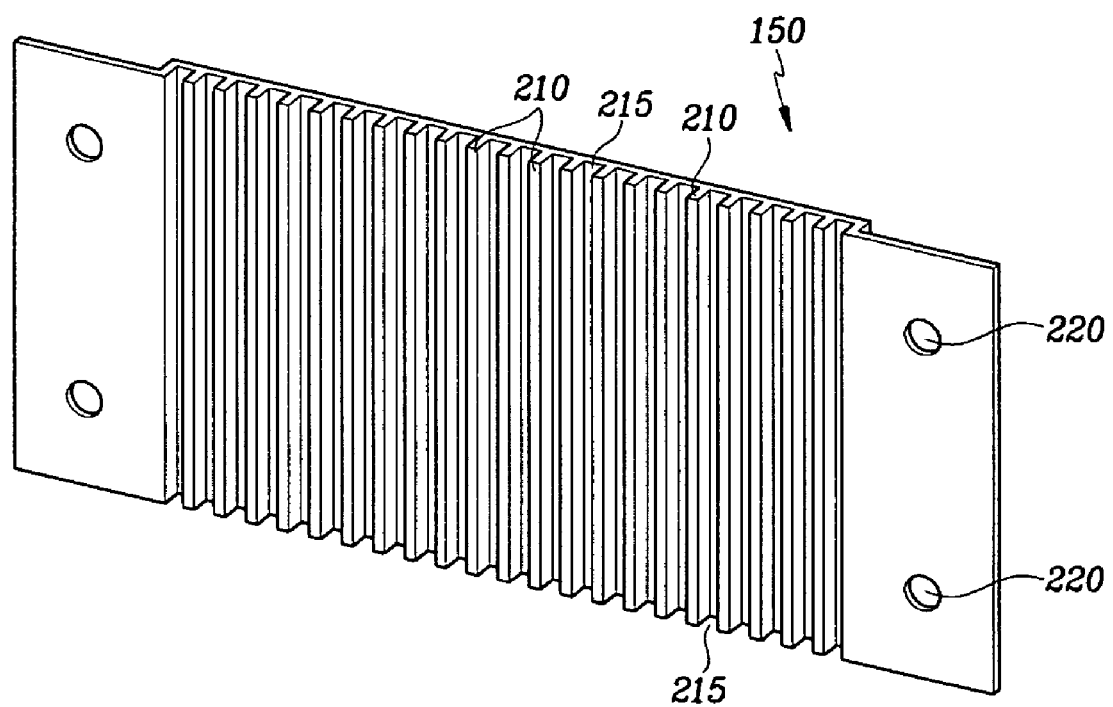
FIG. 2 is an enlarged perspective view of a heat sink used in a plasma display device according to a first embodiment of the present invention.

FIG. 2 is an enlarged perspective view of the heat sink 150 used in a plasma display device according to a first embodiment of the present invention.

As shown in FIG. 2, a plurality of projections 210 are formed on the heat sink 150. According to such projections 210, a heat dissipating area of the heat sink 150 is enlarged and therefore a heat dissipating effect thereof is enhanced.

In this embodiment, the projections 210 are shaped as ribs having vertical walls, and the rib-shaped projections 210 are aligned in a vertical direction of the plasma display device. Therefore, air passages 215 of rectangular cross-sections are vertically formed by the ribs of the heat sink 150. Air heated by the heat sink 150 has a tendency to rise along the air passages 215 formed by the ribs, and therefore, the projections 210 have a function of guiding the heated air.

In addition, conjoining holes 220 are formed near edges of the heat sink 150, for conjoining the heat sink 150 to the chassis base 100.

Figure 3:
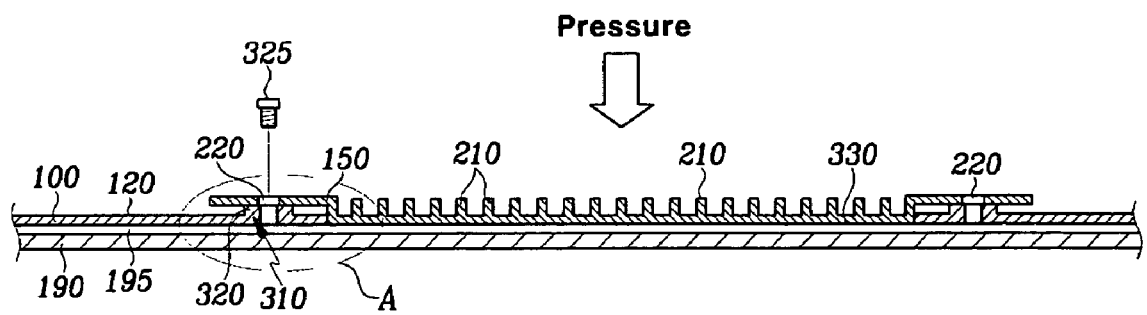
FIG. 3 is a sectional view of FIG. 1 along a line III—III.

FIG. 3 is a sectional view of FIG. 1 along a line III—III, and shows a conjunction structure of the heat sink 150 and the chassis base 100 of a plasma display device.

As shown in FIG. 3, a conjoining device 310 for conjunction to the heat sink 150 is formed at the rear side 120 of the chassis base 100.

In the embodiment shown in FIG. 3, the conjoining device includes a conjoining boss 320 formed at the rear side 120 of the chassis base 100. The conjoining boss 320 and the conjoining hole 220 described above with respect to the heat sink 150 are formed at corresponding positions.

A lower side 330 of the heat sink 150 shown in FIG. 3 contacts the heat conducting medium 195 through the penetration hole 130 of the chassis base 100, and the heat sink 150 contacting the heat conducting medium 195 as such is held by a screw fastener 325 to engage with the conjoining boss 320 through the conjoining hole 220.

The pressure of the heat sink 150 pressing the heat conducting medium 195 may be controlled by, e.g., a thickness t of the chassis base 100, a height h of the boss 320, and a thickness of the heat sink 150. Control of the pressure of the heat sink 150 to the heat conducting medium 195, by such a mechanical specification of the boss 320, the heat sink 150, and the chassis base 100, is hereinafter described in further detail with reference to FIG. 4.

Figure 4:
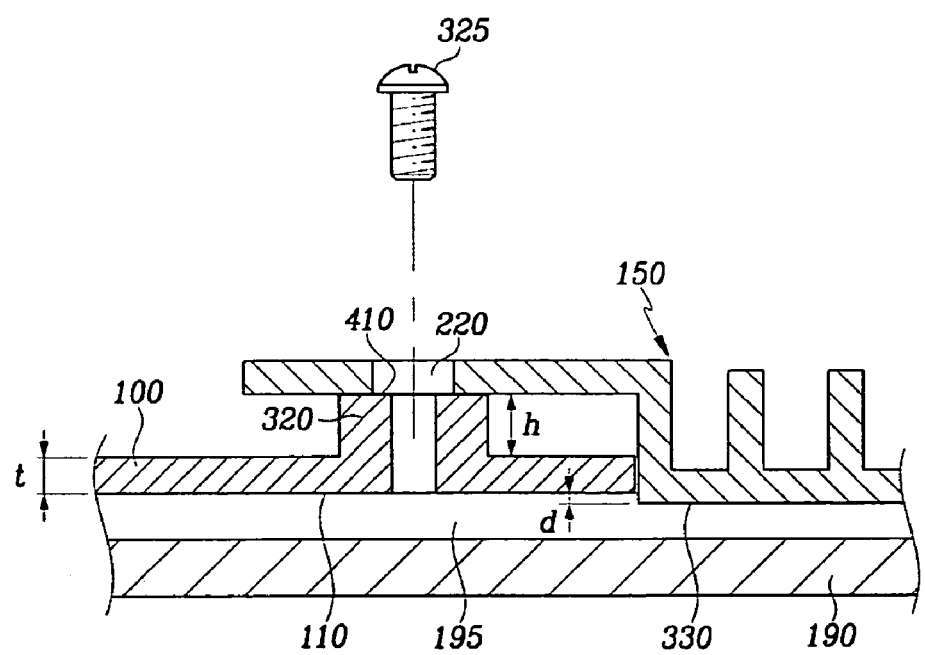
FIG. 4 is an enlarged view of a portion A of FIG. 3.

As shown in FIG. 4, a distance between a rear side 410 of the boss 320 and the front side 110 of the chassis base 100, that is, a sum of a thickness t of the chassis base 100 and a height h of the boss 320, is smaller than a distance between the upper side 410 of the boss 320 and the lower side 330 of the heat sink 150. In other words, a sum of a thickness t of the chassis base 100 and a height h of the boss 320 is smaller than a distance between an area of the heat sink 150 facing the boss 320 and an area of the heat sink 150 facing the heat conducting medium 195.

Therefore, when the heat sink 150 is firmly conjoined to the boss 320, the lower side 330 of the heat sink 150 slightly protrudes toward the heat conducting medium 195 by a distance d with respect to the lower side 110 of the chassis base 100. Due to such a protrusion, the heat sink 150 may be pressurized to the heat conducting medium 195.

In one embodiment the pressure between the lower side 330 of the heat sink 150 and the heat conducting medium 195 is set according to the thickness of the heat conducting medium 195. In another embodiment, this pressure may be set by choosing a specific value of the protrusion distance d. As an example, the protrusion distance d may be set as a value between 0.15 mm to 0.5 mm.

In FIG. 4, the conjoining device 310 is shown to include only the boss 320, and the pressure of the heat sink 150 to the heat conducting medium 195 is formed by a specification, such as height h of the boss 320

However, it is within the scope of the present invention to form the pressure between the heat sink 150 and the heat conducting medium 195 through any suitable means and in reference to any suitable specification.

Figure 5:
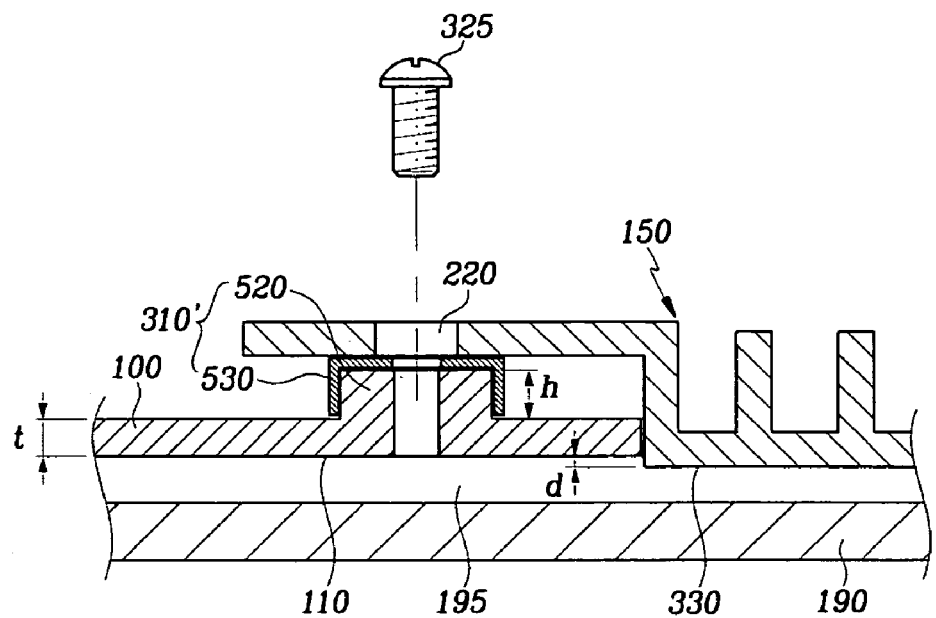
FIG. 5 shows an exemplary variation of a conjoining device of a plasma display device according the present invention.
Figure 6:
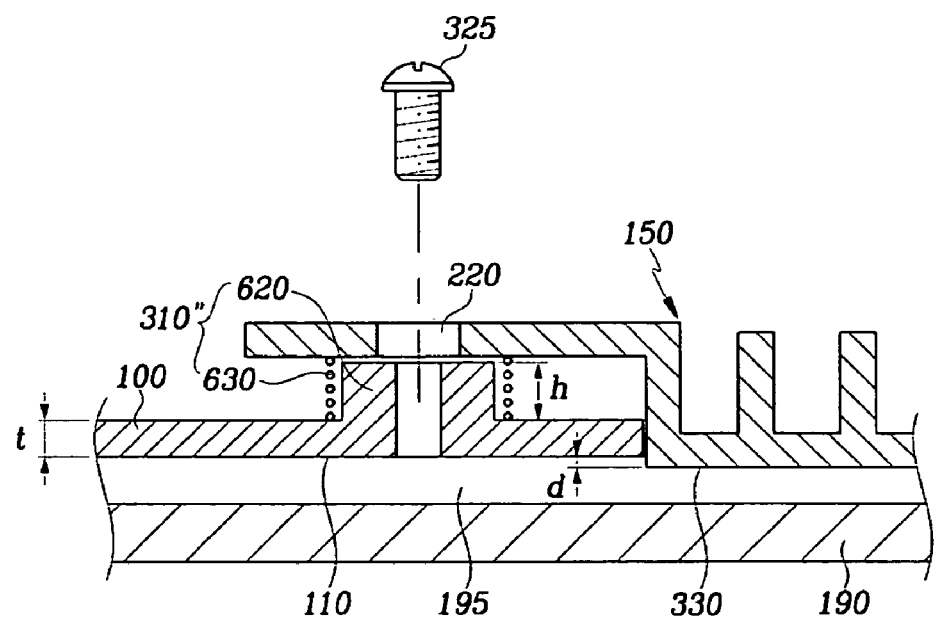
FIG. 6 shows another exemplary variation of a conjoining device of a plasma display device according to the present invention.

Exemplary variations of the conjoining device 310 of a plasma display device are shown in FIGS. 5 and 6. The conjoining devices 310' and 310" include conjoining bosses 520 and 620 and elastic members 530 and 630, respectively, and the elastic members 530 and 630 are disposed above upper ends of the conjoining boss 520 and 620 by at least part thereof.

For example, according to the variation shown in FIG. 5, the boss 520 has a smaller height than the boss 320 shown in FIGS. 3 and 4, and includes a rubber member 530 disposed on an upper end of the boss 520.

In the variation shown in FIG. 6, the boss 620 has smaller height than the boss 320 shown in FIGS. 3 and 4, and includes a coil spring 630 disposed generally coaxially around the boss 620.

In conjoining devices 310' and 310", the pressure between the heat sink 150 and the heat conducting medium 195 may be varied by fastening (or tightening) the screw fastener 325 when the heat sink 150 is conjoined to the bosses 520 and 620 by the screw fastener 325.

According to such variations, a sum of a thickness t of the chassis base 100 and a height h of either of the conjoining boss 520 and 620 is also smaller than a distance between an area of the heat sink 150 facing either of the conjoining bosses 520 and 620 and an area (i.e., the lower side 330) of the heat sink 150 facing the heat conducting medium 195.

The heat sink 150 presses the heat conducting medium 195 through the penetration hole 130 formed at the chassis base 100, as shown in FIG. 1, and, therefore, contact between the heat sink 150 and the heat conducting medium 195 may be enhanced. In addition, the positions of the penetration holes 130 may be designed to be concentrated near a center of the PDP 190 that produces the most heat, so that uniformity of the surface temperature of the PDP 190 may also be enhanced.

Figure 7:
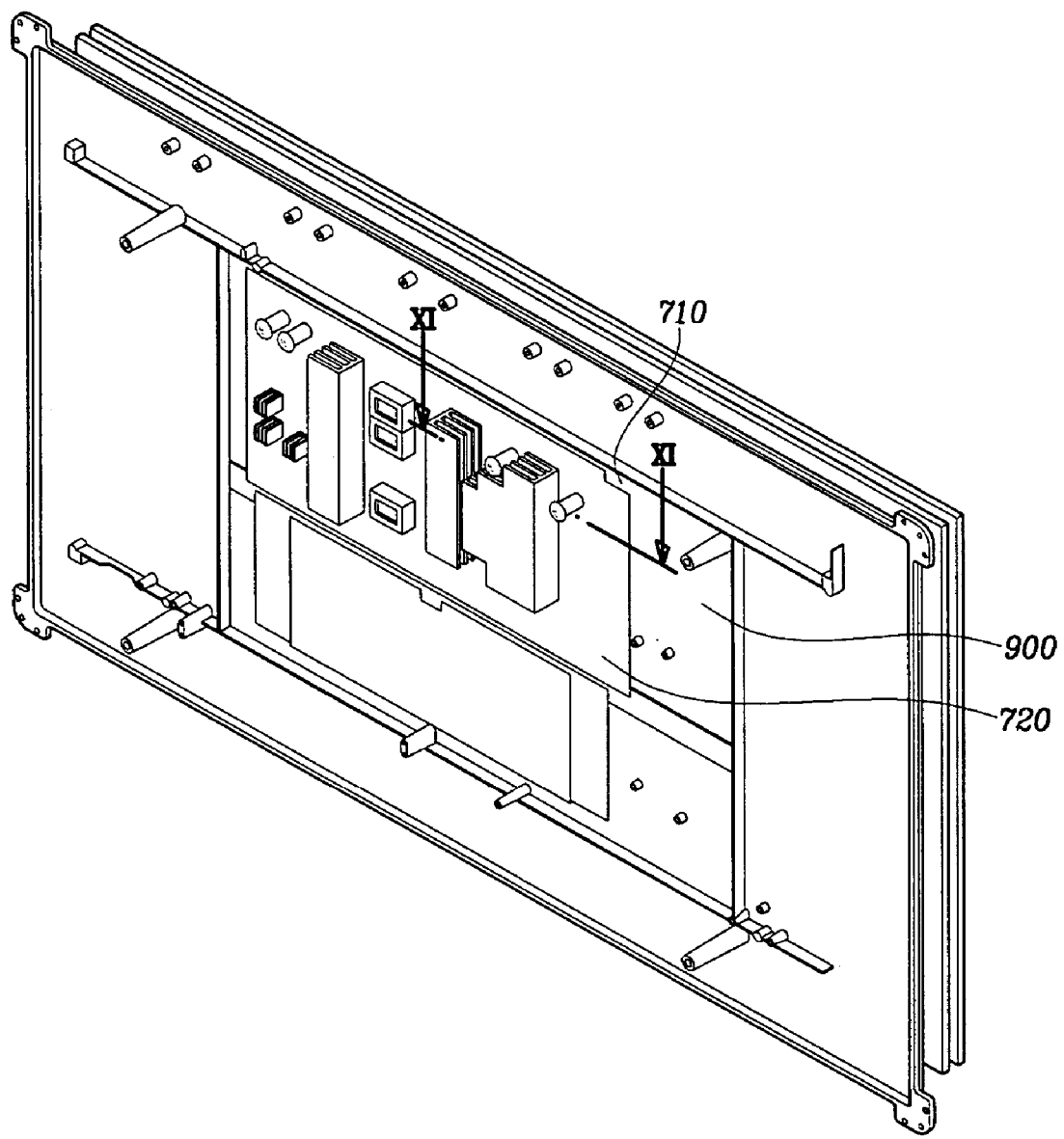
FIG. 7 shows an assembly of a plasma display device according to an embodiment of the present invention.
Figure 8:
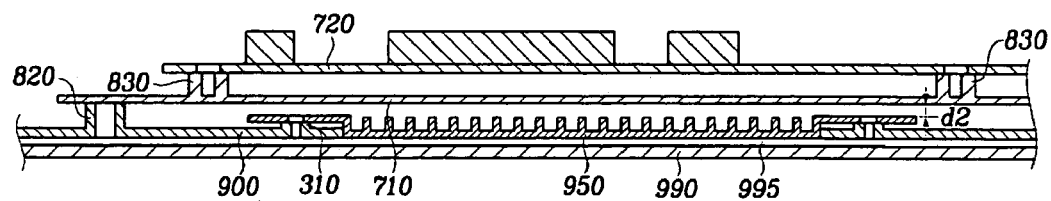
FIG. 8 is a sectional view of the embodiment shown in FIG. 7 along a line VIII—VIII.

In an embodiment shown in FIGS. 7 and 8, one or more circuit boards 720 are mounted to the rear side of the chassis base 900.

The PDP 990, the heat conducting medium 995, the chassis base 900, the heat sink 950, and the conjoining device 310, are similar to those described above in relation to FIGS. 1–6. The embodiment shown in FIGS. 7 and 8 further includes a heat dissipation guide plate 710 for covering the heat sink 950, and a circuit board 720 mounted on the heat dissipation guide plate 710.

Such a mounting structure of the heat dissipation guide plate 710 and the circuit board 720 to the chassis base 900 is hereinafter described with reference to FIG. 8.

FIG. 8 is a sectional view of FIG. 7 along a line XI—XI. As shown in FIG. 8, a second boss 820 for mounting the heat dissipation guide plate 710 is formed at the rear side of the chassis base 900, and the heat dissipation guide plate 710 is mounted to the chassis base 900 through the second boss 820.

In addition, a third boss 830 for mounting a circuit board 720 is formed on the heat dissipation guide plate 710, and the circuit board 720 is mounted to the heat dissipation guide plate 710 through the third boss 830.

In the embodiment shown in FIG. 8, a gap d2 is formed between the heat dissipation guide plate 710 and the heat sink 950. However, such a gap can alternatively be excluded.

Regardless of whether such a gap is formed or not, interposing the heat dissipation guide plate 710 between the heat sink 950 and the circuit board 720 may prevent convective heat transfer from the heat sink 950 to the circuit board 720.

With reference to FIGS. 1 to 8, the heat sinks 150, 950 are shown and described as if they are directly conjoined to the conjoining devices 310, 310', 310". However, the heat sinks 150, 950 may also be conjoined to the conjoining devices 310, 310', 310" by interposing one or more members between them.

In addition, although the heat dissipation guide plates 710, 710' and the heat sinks 150, 950 have been described as separate members mounted to the chassis base 900, they may also be formed as a unit (i.e., a unit body) and may be mounted to the chassis bases 100, 900 as such.

Figure 9:
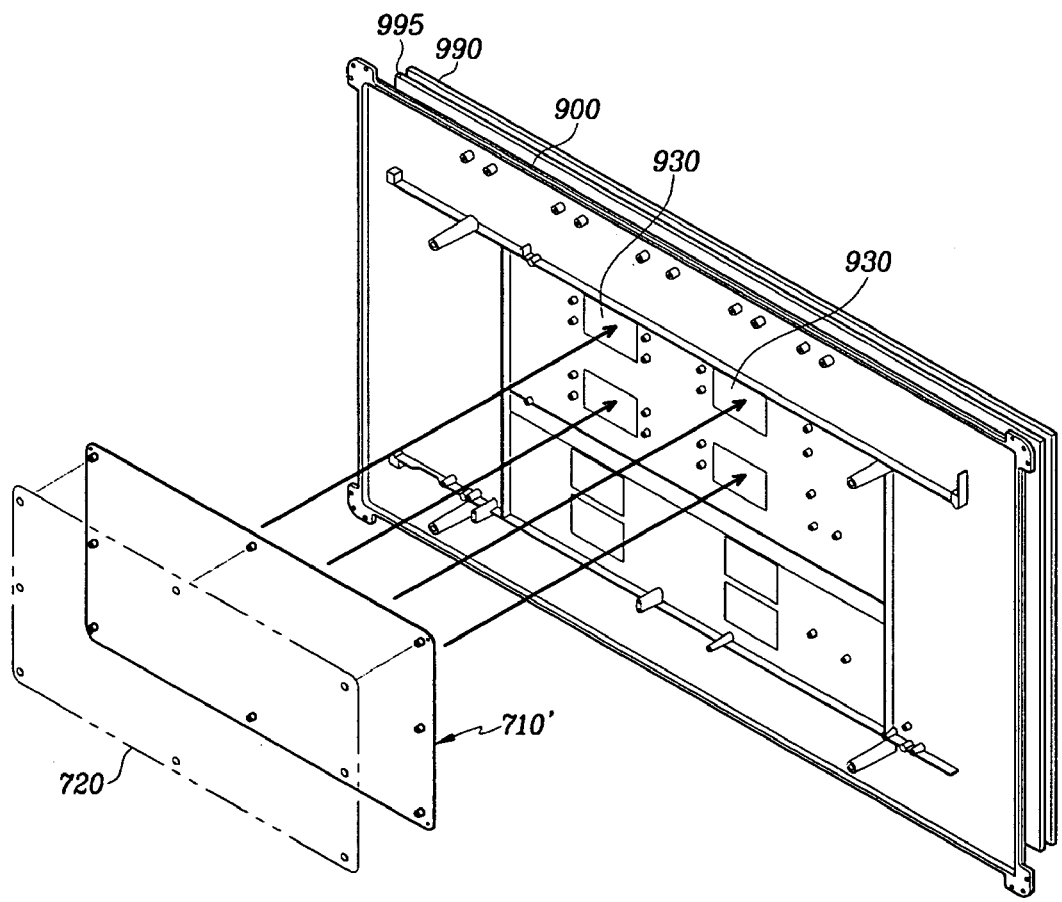
FIG. 9 is an exploded perspective view of a plasma display device according to another embodiment of the present invention.

The embodiment of FIG. 9 shows an exemplary structure of a plasma display device in which a heat sink is unified with a heat dissipation guide plate and is mounted to a conjoining device interposing at least one member. The external features of the plasma display device in FIG. 9, when assembled, are similar to those shown in FIG. 7. The embodiment shown in FIG. 9, includes a chassis base 900, a plasma display panel (PDP) 990 attached at a front side of the chassis base 900 and supported thereby, and a heat conducting medium 995 interposed between the chassis base 900 and the PDP 990 such that heat generated at the PDP 990 may be transferred to the chassis base 900.

The heat conducting medium 995 may be a heat dissipation sheet, as is well known in the art.

Penetration holes 930 are formed in an interior of the chassis base 900. As described with respect to FIGS. 1–8, the scope of the present invention should not be understood to be limited to the number of the penetration holes 930 and their shapes as shown in FIG. 9.

This embodiment also includes a heat dissipation unit 710' for dissipating heat transferred from the heat conducting medium 995 through the penetration holes 930.

The heat dissipation unit 710' is disposed at the penetration holes 930 by at least part thereof (refer to heat sinks 1050 of FIG. 10) and is pressurized toward the heat conducting medium 995. A conjoining device 1110 (refer to FIG. 11) is formed at a rear side of the chassis base 900, for forming a pressure on the heat dissipation unit 710' toward the heat conducting medium 995 such that the heat dissipation unit 710' is pressurized to the heat conducting medium 995. The conjoining device 1110 is described below in further detail.

Figure 10:
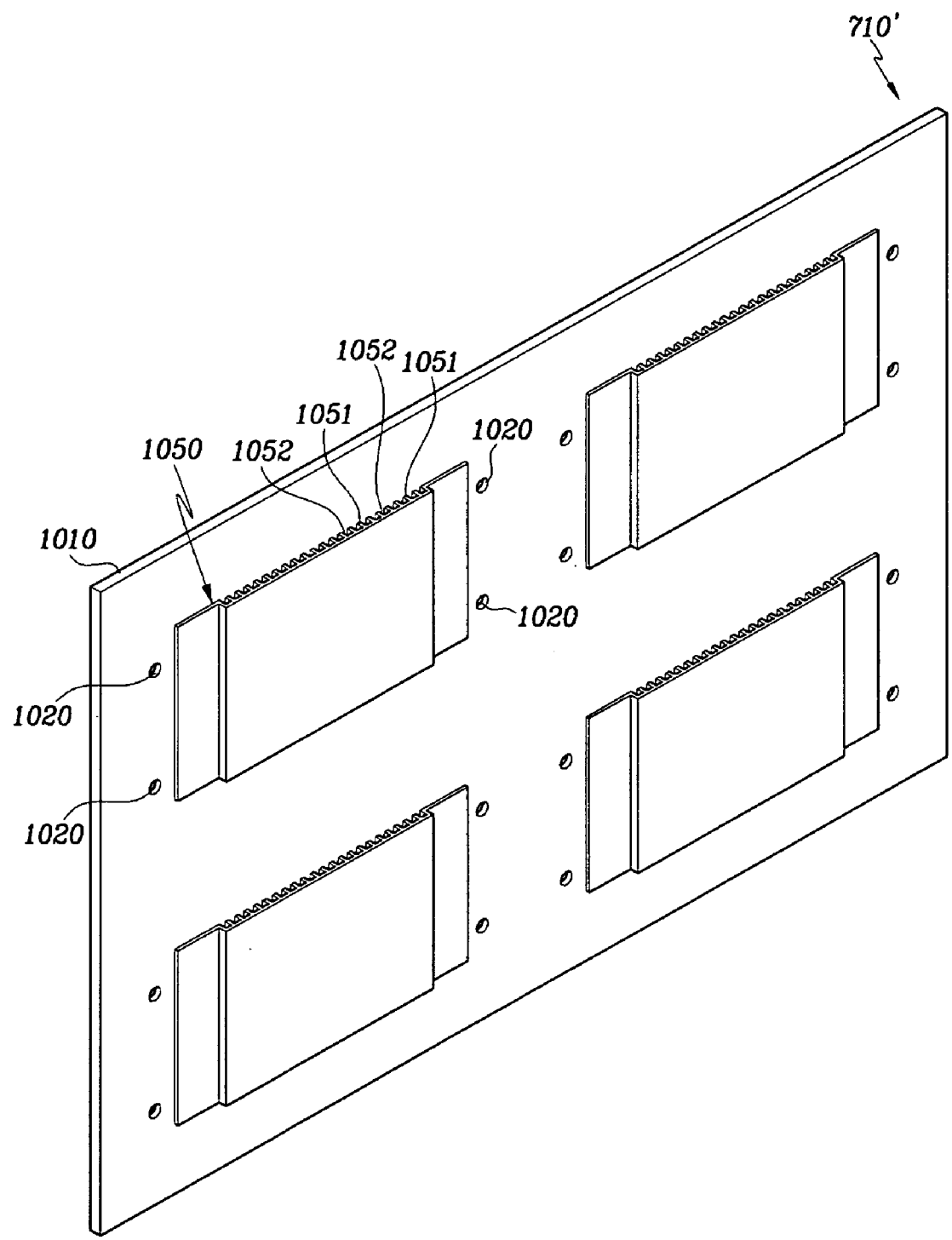
FIG. 10 shows a side of a heat dissipation unit facing a chassis base of the embodiment shown in FIG. 9.

FIG. 10 shows a side of the heat dissipation unit 710' which would face a chassis base 900 of FIG. 9. As shown in FIG. 10, the heat dissipation unit 710' includes a heat dissipation guide plate 1010 and heat sinks 1050, wherein the heat sinks 1050 are welded to the heat dissipation guide plate 1010. Such heat sinks 1050 are disposed at positions corresponding to the penetration holes 930, so they are pressurized to the heat conducting medium 995.

Similar to the heat sinks 150, 950 described with respect to FIGS. 1–8, the heat sinks 1050 include a plurality of projections 1051, and the plurality of projections 1051 vertically form heat dissipation passages 1052.

In the above description, the heat sinks 1050 of the heat dissipation unit 710' are described to be welded to the heat dissipation guide plate 1010. However, they may also be coupled to the heat dissipation guide plate 1010 through other means, such as die-casting.

The plurality of projections 1051 project from a side of the heat dissipation unit 710' contacting the heat conducting medium 995, and they project therefrom in a direction opposite to the chassis base 900. Therefore, the projections 1051 can dissipate heat received from the heat conducting medium 995.

In addition, the heat dissipation guide plate 1010 covers the plurality of projections 1051, and therefore it prevents air heated by the plurality of projections 1051 from moving toward the circuit board 720.

Figure 11:
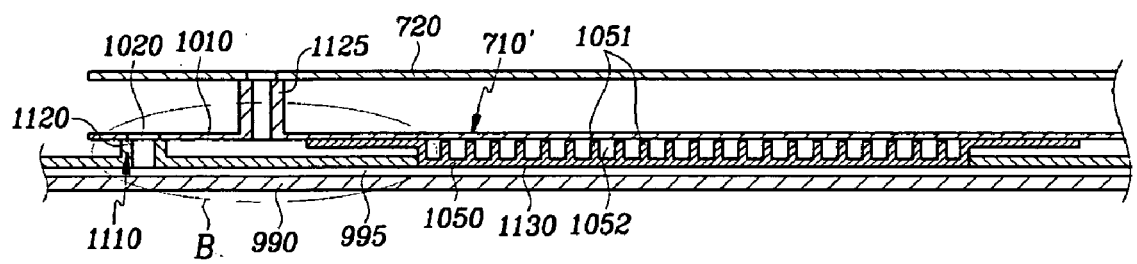
FIG. 11 is a sectional view of the embodiment shown in FIG. 7 along a line XI—XI.

FIG. 11 is a sectional view of FIG. 7 along a line XI—XI. As shown in FIG. 11, a conjoining device 1110 conjoins the heat dissipation guide plate 1010 to the chassis base 900. A conjoining boss 1120 is formed at the chassis base 900. The conjoining boss 1120 and the conjoining hole 1020 described above with respect to the heat dissipation unit 710' are formed at corresponding positions.

A lower side 1130 of the heat dissipation unit 710' contacts the heat conducting medium 995 through the penetration hole 930 of the chassis base 900, and the heat dissipation unit 710' firmly contacts the heat conducting medium 995 and is held by a screw fastener (not shown) engaging with the conjoining boss 1120 through the conjoining hole 1020.

In addition, a second boss 1125 for mounting the circuit board 720 is formed at the heat dissipation guide plate 1010, and the circuit board 720 is mounted at the heat dissipation guide plate 1010 through the second boss 1125.

A small clearance is formed between the projections 1051 of the heat sink 1050 and the heat dissipation guide plate 1010, such that heat conduction from the projections 1051 to the heat dissipation guide plate 1010 may be minimized.

As described with respect to FIGS. 1–8, the pressure of the heat dissipation unit 710' (in more detail, the heat sink 1050) pressing the heat conducting medium 995 may be controlled by a specification such as a thickness t3 of the chassis base 900, a height h3 of the boss 1120, and a thickness of the heat sink 1050.

Figure 12:
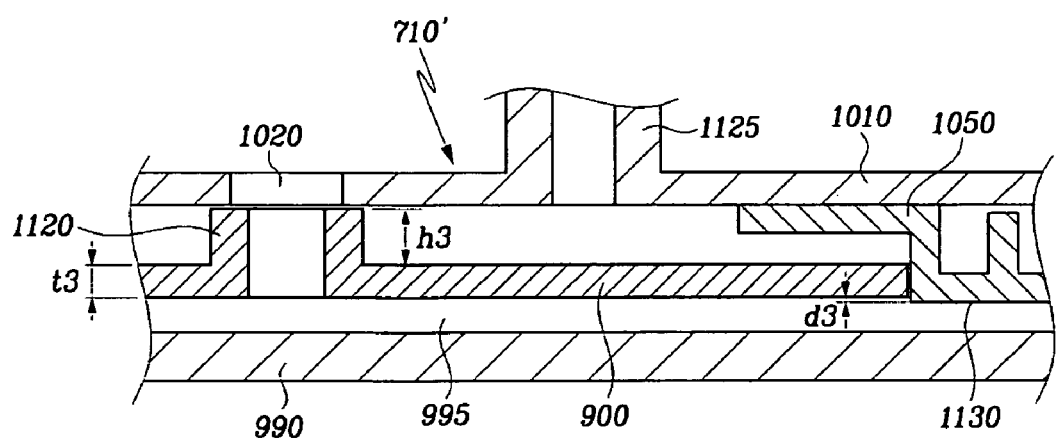
FIG. 12 is an enlarged view of a portion B of FIG. 11.

As shown in FIG. 12, a sum of the thickness t3 of the chassis base 900 and the height h3 of the boss 1120 is smaller than a distance between an area of the heat dissipation unit 710' facing the boss 1120 and an area 1130 of the heat dissipation unit 710' facing the heat conducting medium 995.

As described above, a person of ordinary skill in the art may tailor the pressure by which the heat dissipation unit 710' is pressured to the heat conducting medium 995 and the protrusion distance d3 to suit their particular needs.

Figure 13:
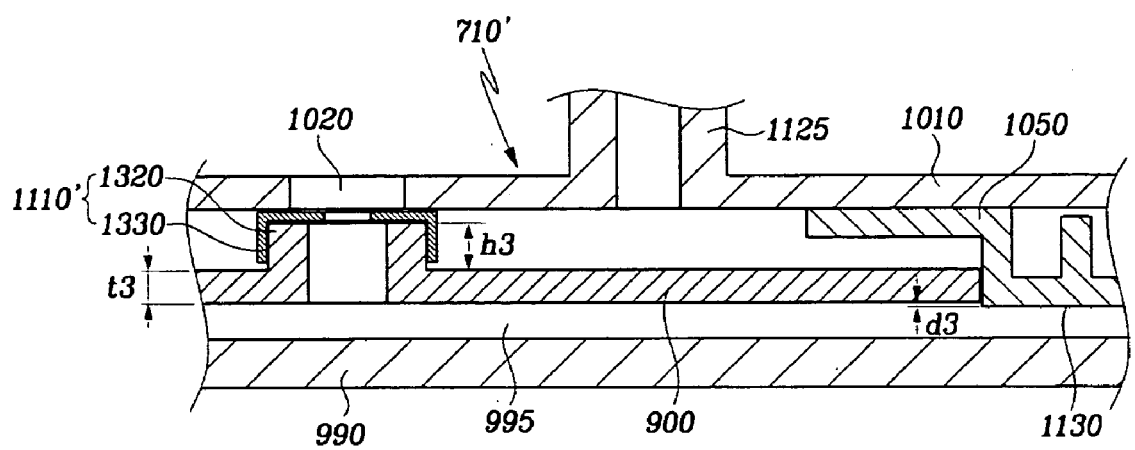
FIG. 13 shows another exemplary variation of a conjoining device according to the present invention.
Figure 14:
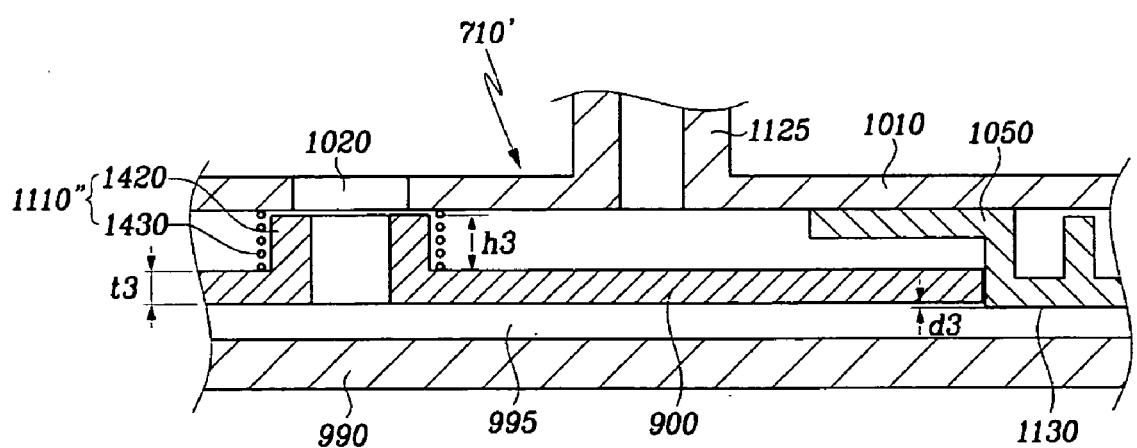
FIG. 14 shows yet another exemplary variation of a conjoining device according to the present invention.

Exemplary variations 1110' and 1110" of the conjoining device are shown in FIGS. 13 and 14. The conjoining devices 1110' and 1110" include conjoining bosses 1320 and 1420 and elastic members 1330 and 1430, respectively, and the elastic members 1330 and 1430 are disposed above upper ends of the conjoining boss 1320 and 1420 by at least part thereof.

For example, according to the variation shown in FIG. 13, the boss 1320 has a smaller height than the boss 1120 shown in FIGS. 11 and 12, and instead, a rubber member 1330 is disposed on an upper end of the boss 1320.

In addition, according to the variation shown in FIG. 14, the boss 1420 has a smaller height than the boss 1120 shown in FIGS. 11 and 12, and instead, a coil spring 1430 is disposed generally coaxially around the boss 1420.

The pressure from the heat dissipation unit 710' to the heat conducting medium 995 may be varied by an amount of fastening (or tightening) of a screw fastener when the heat dissipation unit 710' is conjoined to the bosses 1320 and 1420 by the screw fastener.

As shown in FIGS. 13 and 14, a sum of a thickness t3 of the chassis base 900 and a height h3 of either of the conjoining bosses 1320 and 1420 is also smaller than a distance between an area of the heat dissipation unit 710' facing either of the conjoining bosses 1320 and 1420 and an area 1130 of the heat dissipation unit 710' facing the heat conducting medium 995.

As described above, contacting of heat sinks and a heat conducting medium is enhanced because heat sinks having an area smaller than a PDP are pressed directly to a heat conducting medium.

Heat dissipation may become more efficient at a high temperature region of a PDP, and therefore, temperature deviation and average temperature of a PDP may be lowered.

In addition, air heated by heat sinks may be efficiently exhausted since projections of the heat sinks form air passages.

Furthermore, heating of a circuit board by convection of air heated by the heat sinks may be prevented due to a heat dissipation guide plate that covers the projections of the heat sinks.

The pressure of the heat sinks pressing the heat conducting medium may be easily controlled by setting a specification such as heights of bosses for mounting the heat sinks.

In addition, a tolerance that may be produced during a manufacturing process of a plasma display device may be easily absorbed since the pressure of heat sinks against the heat conducting medium may be easily adjusted due to elastic members between bosses and heat sinks.

Heat sinks and a heat dissipation guide plate may be formed as a unit such that the heat dissipation mechanism may become thinner, and therefore a total thickness of a plasma display device may be decreased.

Although exemplary embodiments of the present invention have been described in detail hereinabove, it should be clearly understood that many variations and/or modifications of the basic inventive concept taught herein, which may appear to those skilled in the art, will still fall within the spirit and scope of the present invention, as defined in the appended claims.

What is claimed is:

1. A plasma display device comprising:
   a plasma display panel;
   a chassis base supporting the plasma display panel and having at least one penetration hole;
   a heat conducting medium interposed between the chassis base and the plasma display panel; and
   a heat sink disposed at the at least one penetration hole and pressing toward the heat conducting medium.

2. The plasma display device of claim 1, further comprising a conjoining device formed at one side of the chassis base, the conjoining device forming a pressure on the heat sink toward the heat conducting medium and conjoining with the heat sink.

3. The plasma display device of claim 2, wherein the conjoining device is conjoined with the heat sink directly.

4. The plasma display device of claim 2, wherein the conjoining device is conjoined with the heat sink through at least one interposed member.

5. The plasma display device of claim 2, wherein a plurality of projections are formed on the heat sink.

6. The plasma display device of claim 5, wherein the heat sink is conjoined with the conjoining device through at least one interposed member, and the at least one interposed member covers the plurality of projections.

7. The plasma display device of claim 5, wherein an air passage of a generally vertical direction is formed by the plurality of projections.

8. The plasma display device of claim 2, further comprising:
   at least one boss on the heat sink, the at least one boss being formed in a direction opposite to the chassis base; and
   at least one circuit board conjoined to the boss.

9. The plasma display device of claim 2, further comprising:
   at least one interposed member between the heat sink and the conjoining device, the at least one interposed member having at least one boss formed in a direction opposite to the chassis base; and
   at least one circuit board conjoined to the at least one boss.

10. The plasma display device of claim 2, wherein:
    the conjoining device comprises a conjoining boss; and
    a sum of a thickness of the chassis base and a height of the conjoining boss is smaller than a distance between an area of the heat sink facing the conjoining boss and an area of the heat sink facing the heat conducting medium.

11. The plasma display device of claim 5, wherein:
    the conjoining device comprises a conjoining boss; and
    a sum of a thickness of the chassis base and a height of the conjoining boss is smaller than a distance between an area of the heat sink facing the conjoining boss and an area of the heat sink facing the heat conducting medium.

12. The plasma display device of claim 8, wherein
    the conjoining device comprises a conjoining boss; and
    a sum of a thickness of the chassis base and a height of the conjoining boss is smaller than a distance between an area of the heat sink facing the conjoining boss and an area of the heat sink facing the heat conducting medium.

13. The plasma display device of claim 2, wherein:
    the conjoining device comprises a conjoining boss and an elastic member; and
    at least part of the elastic member is disposed proximate to an upper end of the conjoining boss.

14. The plasma display device of claim 5, wherein
    the conjoining device comprises a conjoining boss and an elastic member; and
    at least part of the elastic member is disposed proximate to an upper end of the conjoining boss.

15. The plasma display device of claim 8, wherein
    the conjoining device comprises a conjoining boss and an elastic member; and
    at least part of the elastic member is disposed proximate to an upper end of the conjoining boss.

16. The plasma display device of claim 13, wherein the elastic member comprises a rubber member disposed on the upper end of the conjoining boss.

17. The plasma display device of claim 14, wherein the elastic member comprises a rubber member disposed on the upper end of the conjoining boss.

18. The plasma display device of claim 15, wherein the elastic member comprises a rubber member disposed on the upper end of the conjoining boss.

19. The plasma display device of claim 13, wherein the elastic member comprises a spring disposed generally coaxially with the conjoining boss.

20. The plasma display device of claim 14, wherein the elastic member comprises a spring disposed generally coaxially with the conjoining boss.

21. The plasma display device of claim 15, wherein the elastic member comprises a spring disposed generally coaxially with the conjoining boss.

22. A plasma display device comprising:
    a plasma display panel;
    a chassis base for supporting the plasma display panel and having at least one penetration hole;
    a heat conducting medium interposed between the chassis base and the plasma display panel; and
    a heat dissipation unit disposed at the at least one penetration hole by at least part thereof and pressing toward the heat conducting medium.

23. The plasma display device of claim 22, further comprising a conjoining device formed at one side of the chassis base, the conjoining device forming a pressure of the heat dissipation unit toward the heat conducting medium and conjoining the heat dissipation unit to a rear side of the chassis base.

24. The plasma display device of claim 23, wherein a plurality of projections are formed on the heat dissipation unit.

25. The plasma display device of claim 24, wherein an air passage of a generally vertical direction is formed by the plurality of projections.

26. The plasma display device of claim 24, wherein:
the plurality of projections are projected in a direction opposite to the chassis base; and
the heat dissipation unit comprises a plate member for covering the plurality of projections.

27. The plasma display device of claim 23, wherein:
at least one boss is formed on the heat dissipation unit in a direction opposite to the chassis base; and
at least one circuit board is conjoined to the boss.

28. The plasma display device of claim 23, wherein:
the conjoining device comprises a conjoining boss; and
a sum of a thickness of the chassis base and a height of the conjoining boss is smaller than a distance between an area of the heat dissipation unit facing the conjoining boss and an area of the heat dissipation unit facing the heat conducting medium.

29. The plasma display device of claim 24, wherein:
the conjoining device comprises a conjoining boss; and
a sum of a thickness of the chassis base and a height of the conjoining boss is smaller than a distance between an area of the heat dissipation unit facing the conjoining boss and an area of the heat dissipation unit facing the heat conducting medium.

30. The plasma display device of claim 27, wherein:
the conjoining device comprises a conjoining boss; and
a sum of a thickness of the chassis base and a height of the conjoining boss is smaller than a distance between an area of the heat dissipation unit facing the conjoining boss and an area of the heat dissipation unit facing the heat conducting medium.

31. The plasma display device of claim 23, wherein:
the conjoining device comprises a conjoining boss and an elastic member; and
at least part of the elastic member is disposed proximate to an upper end of the conjoining boss.

32. The plasma display device of claim 24, wherein:
the conjoining device comprises a conjoining boss and an elastic member; and
at least part of the elastic member is disposed proximate to an upper end of the conjoining boss.

33. The plasma display device of claim 27, wherein:
the conjoining device comprises a conjoining boss and an elastic member; and
at least part of the elastic member is proximate to an upper end of the conjoining boss.

34. The plasma display device of claim 31, wherein the elastic member comprises a rubber member disposed on the upper end of the conjoining boss.

35. The plasma display device of claim 31, wherein the elastic member comprises a rubber member disposed on the upper end of the conjoining boss.

36. The plasma display device of claim 33, wherein the elastic member comprises a rubber member disposed on the upper end of the conjoining boss.

37. The plasma display device of claim 31, wherein the elastic member comprises a spring disposed generally coaxially with the conjoining boss.

38. The plasma display device of claim 32, wherein the elastic member comprises a spring disposed generally coaxially with the conjoining boss.

39. The plasma display device of claim 33, wherein the elastic member comprises a spring disposed generally coaxially with the conjoining boss.

* * * * *